(12) United States Patent
Chen et al.

(10) Patent No.: US 10,170,422 B2
(45) Date of Patent: Jan. 1, 2019

(54) POWER STRAP STRUCTURE FOR HIGH PERFORMANCE AND LOW CURRENT DENSITY

(71) Applicant: Taiwan Semiconductor Manufacturing Co., Ltd., Hsin-Chu (TW)

(72) Inventors: Chih-Liang Chen, Hsinchu (TW); Chih-Ming Lai, Hsinchu (TW); Charles Chew-Yuen Young, Cupertino, CA (US); Chi-Yeh Yu, Hsinchu (TW); Jiann-Tyng Tzeng, Hsin Chu (TW); Kam-Tou Sio, Zhubei (TW); Pin-Dai Sue, Tainan (TW); Ru-Gun Liu, Zhubei (TW); Shih-Wei Peng, Hsinchu (TW); Wen-Hao Chen, Hsinchu (TW); Yung-Sung Yen, New Taipei (TW); Chun-Kuang Chen, Guanxi Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/898,882

(22) Filed: Feb. 19, 2018

(65) Prior Publication Data

US 2018/0174967 A1 Jun. 21, 2018

Related U.S. Application Data

(63) Continuation of application No. 15/143,842, filed on May 2, 2016, now Pat. No. 9,911,697.

(51) Int. Cl.
*H01L 23/528* (2006.01)
*H01L 27/092* (2006.01)
(Continued)

(52) U.S. Cl.
CPC .. *H01L 23/5286* (2013.01); *H01L 21/823821* (2013.01); *H01L 21/823871* (2013.01);
(Continued)

(58) Field of Classification Search
CPC ......... H01L 23/5286; H01L 21/823821; H01L 21/823871; H01L 23/522; H01L 23/5222;
(Continued)

(56) References Cited

U.S. PATENT DOCUMENTS

| | | | | |
|---|---|---|---|---|
| 2006/0289994 A1* | 12/2006 | Greenberg | ............ | H01L 23/528 257/758 |
| 2013/0126978 A1* | 5/2013 | Becker | .................. | H01L 27/092 257/369 |

(Continued)

OTHER PUBLICATIONS

Non-Final Office Action dated Mar. 20, 2017 for U.S. Appl. No. 15/143,842.
(Continued)

*Primary Examiner* — Walter H Swanson
(74) *Attorney, Agent, or Firm* — Eschweiler & Potashnik, LLC

(57) ABSTRACT

The present disclosure, in some embodiments, relates to a method of forming an integrated chip. The method is performed by forming gate structures and middle-end-of-the-line (MEOL) structures extending in a first direction over an active area of a substrate. The MEOL structures are interleaved between the gate structures along a second direction. The method further forms a power rail and a first metal wire extending in the second direction. The first metal wire is over the MEOL structures. A double patterning process is performed to form second and third metal wires extending in the first direction over the first metal wire and separated in the second direction. The second metal wire is cut according to a first cut region of a first cut mask to define a first metal
(Continued)

strap connecting a first one of the MEOL structures to the power rail.

20 Claims, 10 Drawing Sheets

(51) Int. Cl.
*H01L 21/8238* (2006.01)
*H01L 23/522* (2006.01)
(52) U.S. Cl.
CPC ........ *H01L 23/522* (2013.01); *H01L 23/5222* (2013.01); *H01L 27/0924* (2013.01)
(58) Field of Classification Search
CPC ............. H01L 27/0924; H01L 21/8238; H01L 27/092–27/0928
See application file for complete search history.

(56) References Cited

U.S. PATENT DOCUMENTS

| | | | |
|---|---|---|---|
| 2015/0347659 A1* | 12/2015 | Chiang | H01L 27/0207 257/369 |
| 2016/0049369 A1 | 2/2016 | Heo | |
| 2018/0068954 A1* | 3/2018 | Lin | H01L 23/53209 |

OTHER PUBLICATIONS

Final Office Action dated Jul. 20, 2017 for U.S. Appl. No. 15/143,842.
Notice of Allowance dated Oct. 20, 2017 for U.S. Appl. No. 15/143,842.

\* cited by examiner

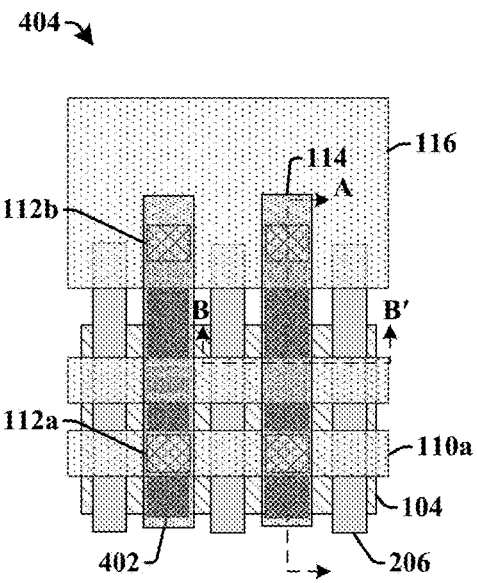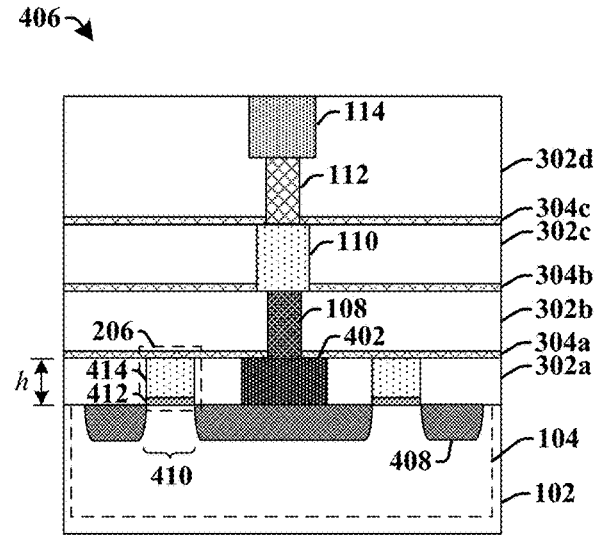
Fig. 4B
Fig. 4C
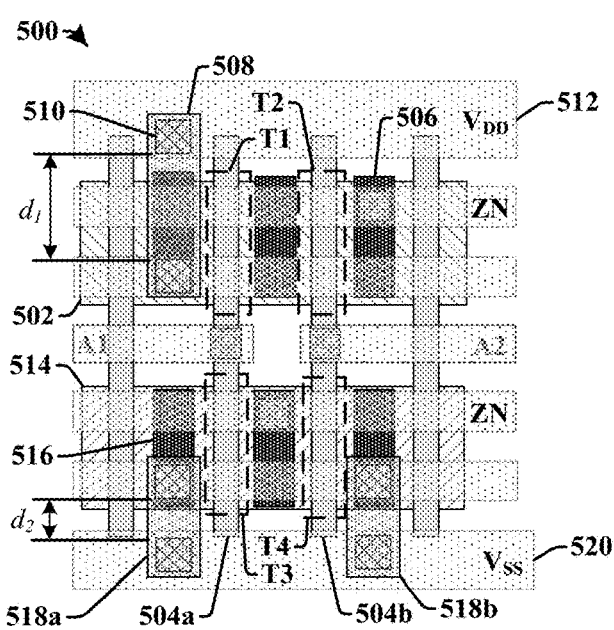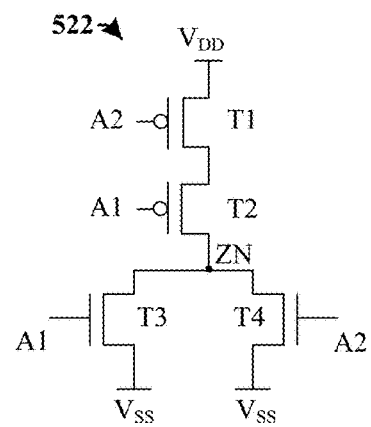
Fig. 5A
Fig. 5B

POWER STRAP STRUCTURE FOR HIGH PERFORMANCE AND LOW CURRENT DENSITY

REFERENCE TO RELATED APPLICATION

This Application is a Continuation of U.S. application Ser. No. 15/143,842 filed on May 2, 2016, the contents of which are hereby incorporated by reference in their entirety.

BACKGROUND

Over the last four decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern day integrated chips may comprise millions or billions of semiconductor devices arranged on a single semiconductor die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4C illustrate some additional embodiments of an integrated chip having a metal strap configured to couple a MEOL layer to a power rail.

FIGS. 5A-5B illustrate some embodiments of a NAND gate comprising a MEOL layer having a metal strap configured to couple a MEOL layer to a power rail.

DETAILED DESCRIPTION

Figure 1:
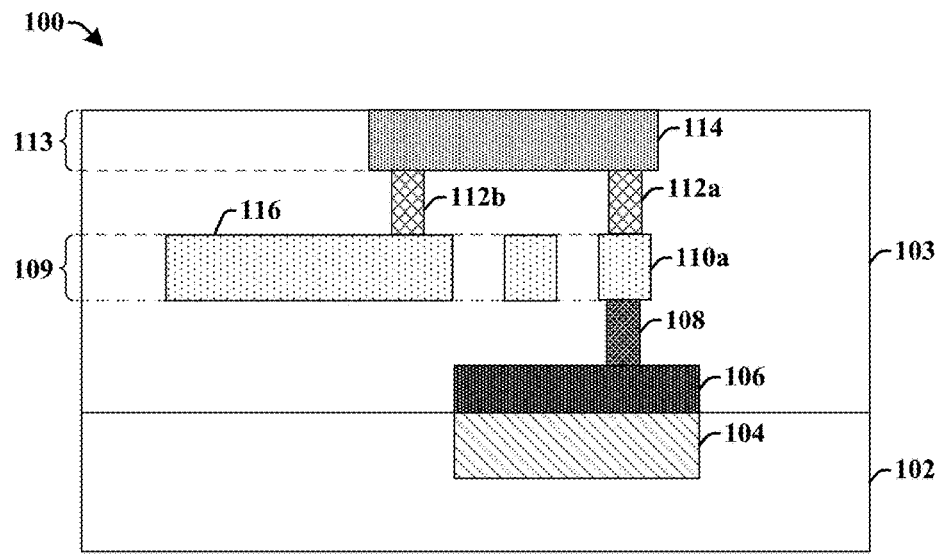
FIG. 1 illustrates a cross-sectional view of some embodiments of an integrated chip having a metal strap configured to couple a middle-end-of-the-line (MEOL) layer to a power rail.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In emerging technology nodes, the small size of transistor components may cause restrictive topology choices for back-end-of-the-line (BEOL) metal layer routing. To alleviate metal layer routing problems, middle-end-of-the-line (MEOL) local interconnection layers may be used. MEOL local interconnect layers are conductive metal layers that are vertically positioned between a front-end-of-line (FEOL) (e.g., a transistor) and the BEOL. MEOL local interconnect layers can provide very high-density local routing that avoids consumption of scarce routing resources on lower BEOL metal layers.

Often MEOL layers are used to connect an active area (e.g., having source/drain regions) directly to a power rail or to a metal interconnect wire carrying an output signal. While MEOL layers advantageously improve BEOL metal interconnect routing for such applications, the MEOL layers have a small size and a close proximity to gate structures that leads to a number of drawbacks. For example, it has been appreciated that in emerging technology nodes (e.g., 14 nm, 10 nm, 7 nm, etc.) the small distance between MEOL structures and gate structures is becoming small enough to produce a parasitic capacitance that significantly degrades transistor device performance. Furthermore, the small size of the MEOL layers leads to a high current density through the MEOL layers. The high current density can lead to reliability concerns due to electromigration.

The present disclosure relates to an integrated chip that uses a metal strap to improve performance and to reduce electromigration by coupling a middle-end-of-the-line (MEOL) layer to a power rail on a BEOL layer. In some embodiments, the integrated chip comprises an active area having a plurality of source/drain regions. The active area contacts a middle-end-of-the-line (MEOL) structure extending in a first direction. A first metal wire extends in a second direction, which is perpendicular to the first direction, at a location overlying the MEOL structure. A metal strap extending in the first direction is arranged over the first metal wire. The metal strap is configured to connect the first metal line to a power rail (e.g., that may be held at a supply voltage or a ground voltage), which extends in the second direction. By connecting the MEOL structure to the power rail by way of a metal strap, parasitic capacitance is reduced since the distance between the metal strap and the gate structures is increased. Furthermore, electromigration may be reduced by providing current from the MEOL structure to the metal strap, which may have a larger size than the MEOL structure.

FIG. 1 illustrates some embodiments of an integrated chip 100 having a metal strap configured to couple a middle-end-of-the-line (MEOL) layer to a power rail.

The integrated chip 100 includes an active area 104 comprising a plurality source/drain regions. In some embodiments, the source/drain regions may be arranged within a semiconductor substrate 102. A middle-end-of-the-line (MEOL) structure 106 is arranged over the active area 104. The MEOL structure 106 comprises a conductive material that physically contacts an upper surface of the active area 104 (e.g., so as to make electrical contact to the active area 104 without the use of a contact). A first metal wire layer 109 vertically overlies the MEOL structure 106. The MEOL structures 106 is coupled to a first metal wire 110a within the first metal wire layer 109 by way of a conductive contact 108 arranged vertically therebetween.

A second metal wire layer 113 comprising a metal strap 114 is arranged over the first metal wire 110a. The metal strap 114 is connected to the first metal wire 110a by way of a conductive via 112 arranged therebetween. In some embodiments, the metal strap 114 may have a larger size (i.e., cross-sectional area) than the MEOL structure 106. For example, in various embodiments, the metal strap 114 may have a larger height and/or width than the MEOL structure 106. The metal strap 114 is configured to connect the first metal wire 110a to a power rail 116 that is configured to distribute power from integrated chip pins to multiple devices in the integrated chip 100. In various embodiments, the power rail 116 may be configured to be held at a supply voltage (e.g., $V_{DD}$) or a ground voltage (e.g., $V_{SS}$)

In some embodiments, the power rail 116 may be comprise within the first metal wire layer 109 at a location that is laterally separated from the first metal wire 110a by a dielectric material 103. In such embodiments, the metal strap 114 laterally extends from over the first metal wire 110a to over the power rail 116. The metal strap 114 is connected to the first metal wire 110a by way of a first conductive via 112a and to the power rail 116 by way of a second conductive via 112b. In other embodiments, the power rail 116 may be comprised within a metal wire layer overlying the first metal wire layer 109.

By connecting the first metal wire 110a to the power rail 116 by way of the metal strap 114, a low-resistance path is formed between the MEOL structure 106 and the power rail 116. The low resistance path reduces parasitic capacitance since a distance between the metal strap 114 and gate structures (not shown) is increased. Furthermore, electromigration may be reduced thereby improving reliability of the integrated chip 100.

Figure 2:
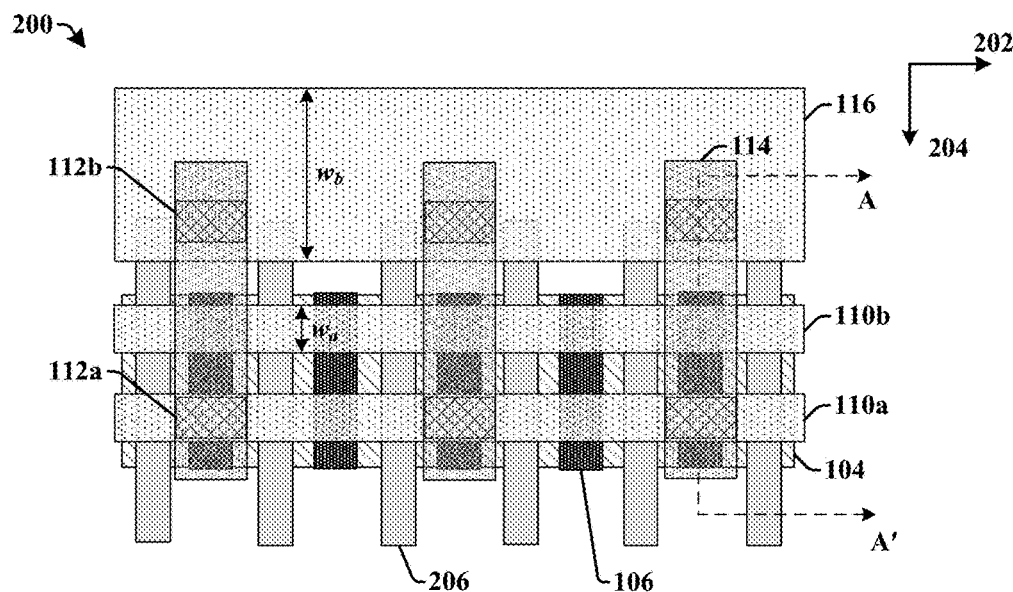
FIG. 2 illustrates a top-view of some embodiments of an integrated chip having a metal strap configured to couple a MEOL layer to a power rail.

FIG. 2 illustrates a top-view of an integrated chip 200 having a metal strap configured to couple a middle-end-of-the-line (MEOL) layer to a power rail.

The integrated chip 200 comprises an active area 104 that extends along a first direction 202. A plurality of gate structures 206 extend over the active area 104 along a second direction 204 that is perpendicular to the first direction 202. A plurality of middle-end-of-the-line (MEOL) structures 106 are arranged over the active area 104. The plurality of MEOL structures 106 extend along the second direction at locations between adjacent ones of the plurality of gate structures 206.

A first metal wire layer 109 is arranged over the plurality of gate structures 206 and the plurality of MEOL structures 106. In some embodiments, the first metal wire layer 109 comprises a first metal wire 110a overlying the active area 104, a second metal wire 110b, and a power rail 116 extending in the first direction. In some embodiments, the plurality of MEOL structures 106 and the active area 104 may be offset from the power rail 116 in the second direction 204. In some embodiments, the power rail 116 has a width $w_b$ that is larger than a width $w_a$ of the first metal wire 110a.

A second metal wire layer comprising a plurality of metal straps 114 is arranged vertically over the first metal wire layer 109. The plurality of metal straps 114 extend in the second direction 204 from over the plurality of MEOL structures 106 to over the power rail 116. In some embodiments, the plurality of metal straps 114 may extend past the underlying plurality of MEOL structures 106 in the second direction 204. The plurality of metal straps 114 are coupled to the first metal wire 110a by a first conductive contact 112a and is further coupled to the power rail 116 by a second conductive via 112b. By connecting the first metal wire 110a to the power rail 116 by way of the metal strap 114, a low-resistance path is formed between the plurality of MEOL structures 106 and the power rail 116.

Figure 3:
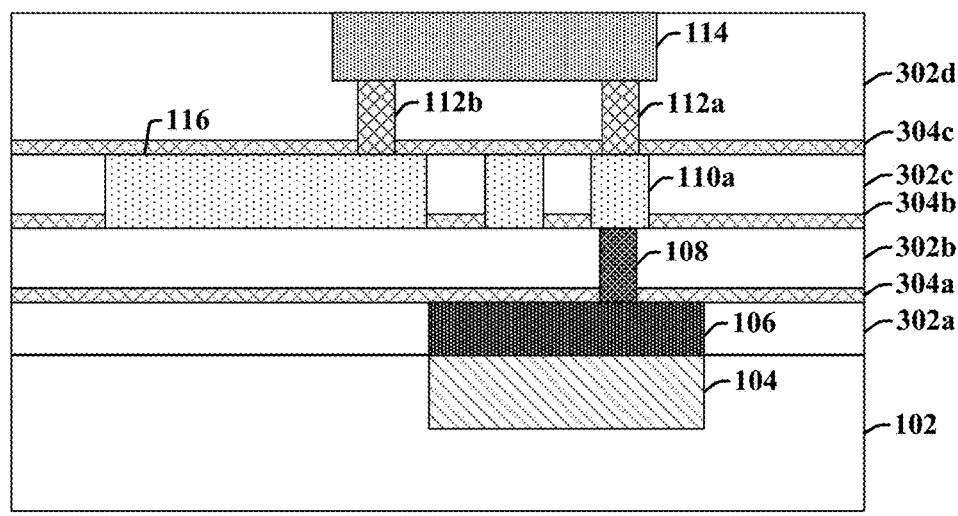
FIG. 3 illustrates a cross-sectional view of some additional embodiments of an integrated chip having a metal strap configured to couple a MEOL layer to a power rail.

FIG. 3 illustrates a cross-sectional view of some additional embodiments of an integrated chip 300 having a metal strap configured to couple a MEOL layer to a power rail.

The integrated chip 300 comprises an active area 104 comprising a plurality of source/drain regions arranged within a semiconductor substrate 102. A MEOL structure 106 is arranged onto the active area 104. In various embodiments, the MEOL structure 106 may comprise a conductive metal (e.g., tungsten, copper, cobalt, etc.). A first inter-level dielectric (ILD) layer 302a is arranged over the semiconductor substrate 102 at locations laterally surrounding the MEOL structure 106.

A conductive contact 108 is disposed within a second ILD layer 302b overlying the first ILD layer 302a. The conductive contact 108 is configured to connect the MEOL structure 106 to a first metal wire 110a arranged within a third ILD layer 302c overlying the second ILD layer 302b. The first metal wire 110a is connected to a power rail 116 by way of a first conductive via 112a, a metal strap 114, and a second conductive via 112b. The first conductive via 112a, the metal strap 114, and the second conductive via 112b are arranged within the fourth ILD layer 302d overlying the third ILD layer 302c.

In some embodiments, the conductive contact 108, the first conductive via 112a, and/or the second conductive via 112b may comprise tungsten and/or copper. In some embodiments, the first metal wire layer 109, the metal strap 114, and/or the power rail 116 may comprise copper. In various embodiments, the ILD layers 302a-302d may comprise one or more of a low-k dielectric layer, an ultra low-k dielectric layer, an extreme low-k dielectric layer, and/or a silicon dioxide layer.

In some embodiments, adjacent ILD layers 302a-302d may be separated by etch stop layers 304a-304c. For example, the first ILD layer 302a may be vertically separated from the second ILD layer 302b by a first etch stop layer 304a, and the second ILD layer 302b may be vertically separated from the third ILD layer 302c by a second etch stop layer 304b, etc. In various embodiments, the etch stop layers 304a-302d may comprise a nitride, such as silicon nitride, for example.

Figure 4A:
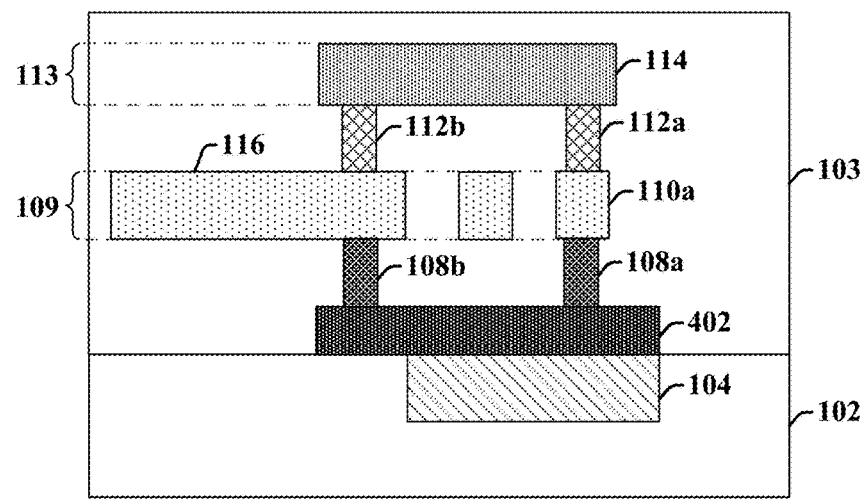

FIG. 4A illustrates a cross-sectional view of some additional embodiments of an integrated chip 400 having a metal strap configured to couple a MEOL layer to a power rail.

The integrated chip 400 comprises an active area 104 arranged within a semiconductor substrate 102. A MEOL structure 402 is arranged over the active area 104. The MEOL structure 402 laterally extends past the active area 104. A first metal wire layer 109 comprising a first metal wire 110a and a power rail 116 is arranged over the MEOL structure 402. A first conductive contact 108a is vertically arranged between the MEOL structure 402 and the first metal wire 110a. A second conductive contact 108b is vertically arranged between the MEOL structure 402 and the power rail 116. Connecting the MEOL structure 402 to the power rail 116 by way of the second conductive contact 108b forms a first conductive path between the MEOL structure 402 and the power rail 116.

A metal strap 114 is arranged over the first metal wire layer 109. The metal strap is connected to the first metal wire 110a by a first conductive via 112a and to the power rail 116 by a second conductive via 112b. Connecting the first metal wire 110a to the power rail 116 by way of the metal strap 114 forms a second conductive path between the MEOL structure 402 and the power rail 116. The first and second conductive paths collectively provide for reduced current density between the MEOL structure 402 and the power rail 116, thereby reducing electromigration.

FIG. 4B illustrates a top-view 404 corresponding to the cross-sectional view (along cross-sectional line A-A') of FIG. 4A. As shown in top-view 404 the MEOL structure 402 extends from over the active area 104 to under the power rail 116. The metal strap 114 extends from over the active area 104 to over the power rail 116 at a location that overlies the MEOL structure 402.

FIG. 4C illustrates a cross-sectional view 406 (along cross-sectional line B-B') corresponding to top-view 404 of FIG. 4B.

As shown in cross-sectional view 406, the active area 104 comprises a plurality of source/drain regions 408. The plurality of source/drain regions 408 comprise highly doped regions (e.g., having a doping concentration greater than that of the surrounding semiconductor substrate 102) that are laterally separated from one another by channel regions 410.

The MEOL structure 402 is arranged over the source/drain regions 408, while a plurality of gate structures 206 are arranged over the channel regions 410. In some embodiments, the plurality of gate structures 206 may respectively comprise a gate electrode 414 separated from the semiconductor substrate 102 by way of a gate dielectric 412. In various embodiments, the gate electrode 414 may comprise polysilicon or a metal (e.g., aluminum). In various embodiments, the gate dielectric 412 may comprise an oxide (e.g., silicon dioxide) or a high-k material. In some embodiments, the plurality of gate structures 206 and the MEOL structure 402 may have an approximately same height h.

FIG. 5A illustrates a top-view of some embodiments of a NAND gate 500 having a metal strap configured to couple a MEOL layer to a power rail. FIG. 5B illustrates a corresponding schematic diagram 522 of the NAND gate of FIG. 5A.

As shown in FIG. 5A, the NAND gate 500 comprises a first active area 502 and a second active area 514. The first active area 502 comprises a plurality of source/drain regions having p-type dopants. The second active area 514 comprises a plurality of source/drain regions having n-type dopants.

A first gate structure 504a and a second gate structure 504b extend over the first active area 502 to form a first PMOS transistor T1 and a second PMOS transistor T2 arranged in series between an output node ZN and a first power rail 512 held at a source voltage $V_{DD}$. The first and second PMOS transistors, T1 and T2, are drive by inputs A1 and A2. A first plurality of MEOL structures 506 are arranged over the first active area 502. A first metal strap 508 is connected between one of the first plurality of MEOL structures 506 and the first power rail 512 by way of conductive contacts 510, so that the first metal strap 508 connects a source region of the first PMOS transistor T1 to the first power rail 512. In some embodiments, the conductive contacts 510 connecting the first metal strap between one of the first plurality of MEOL structures 506 and the first power rail 512 may be separated by a first distance $d_1$.

The first gate structure 504a and the second gate structure 504b also extend over the second active area 514 to form a first NMOS transistor T3 and a second NMOS transistor T4 arranged in parallel between output node ZN and a second power rail 520 held at a ground voltage $V_{SS}$. The first and second NMOS transistors, T3 and T4, are drive by inputs A1 and A2. A second plurality of MEOL structures 516 are arranged over the second active area 514. A second metal strap 518a and a third metal strap 518b are connected between two of the second plurality of MEOL structures 516 and the second power rail 520 by way of conductive contacts, so that the second metal strap 518a and the third metal strap 518b connect drain regions of the first NMOS transistor T3 and the second NMOS transistor T4 to the second power rail 520. In some embodiments, the conductive contacts 510 connecting the first metal strap between two of the second plurality of MEOL structures 516 and the second power rail 520 may be separated by a second distance $d_2$ that is smaller than the first distance $d_1$.

Figure 6A:
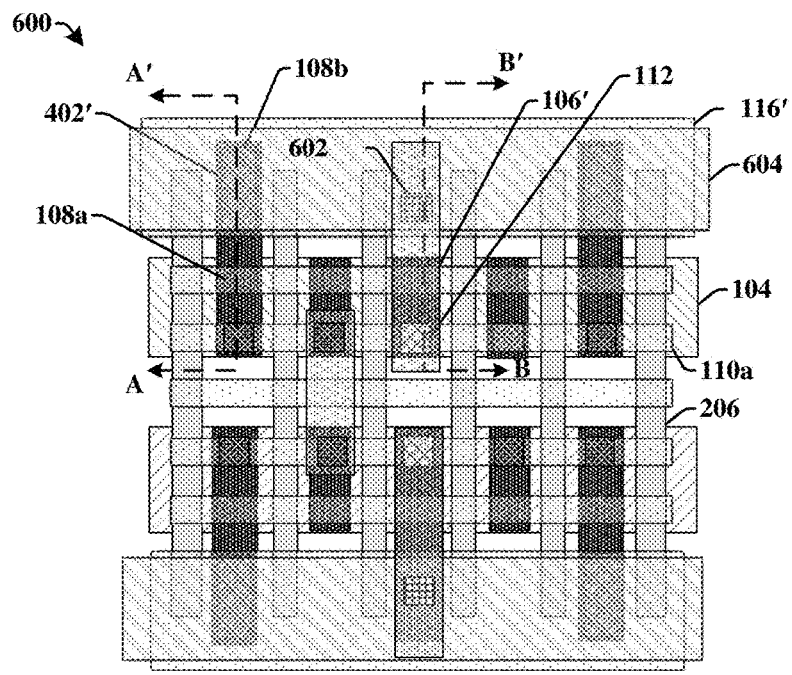
FIGS. 6A-6C illustrate some additional embodiments of an integrated chip having a metal strap configured to couple a MEOL layer to a power rail.
Figures 6B, 6C:
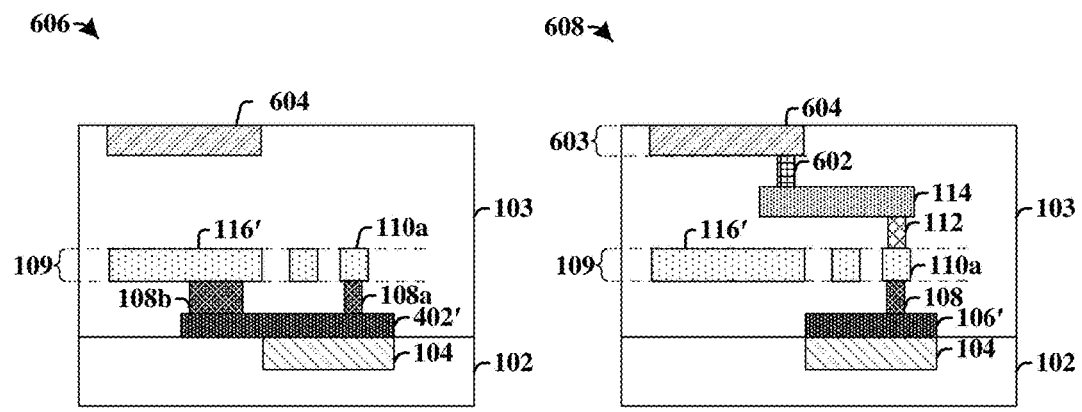

FIG. 6A illustrates a top-view of an integrated chip 600 having a MEOL layer coupled to multiple power rails. FIG. 6B illustrates a cross-sectional view 606 of the integrated chip 600 along cross-sectional line A-A' and FIG. 6C illustrates a cross-sectional view 608 of the integrated chip 600 along cross-sectional line B-B'.

As shown in cross-sectional view 606, a first MEOL structure 402' is arranged over an active area 104 and is coupled to a first power rail 116' on a first metal wire layer 109 by way of a second conductive contact 108b. As shown in cross-sectional view 608, a second MEOL structure 106' is arranged over the active area 104 and is coupled to a second power rail 604 on a second metal layer 603 by way of a metal strap 114 and a conductive contact 602. By connecting the first MEOL structure 402' to the first power rail 116' and by connecting the second MEOL structure 106' to the second power rail 604, the current density of the current provided through the MEOL layer (i.e., the first MEOL structure 402' and the second MEOL structure 106') is reduced, thereby reducing electromigration and parasitic capacitance.

Figure 7A:
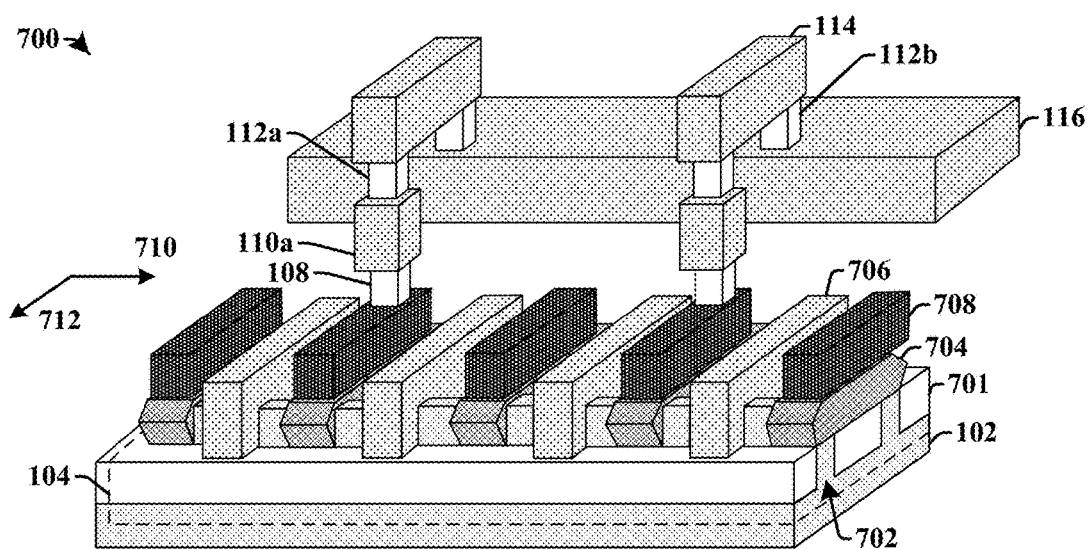
FIGS. 7A-7C illustrates three-dimensional views of some embodiments of a metal strap configured to couple a MEOL layer overlying a multi-gate FinFET device to a power rail.
Figure 7B:
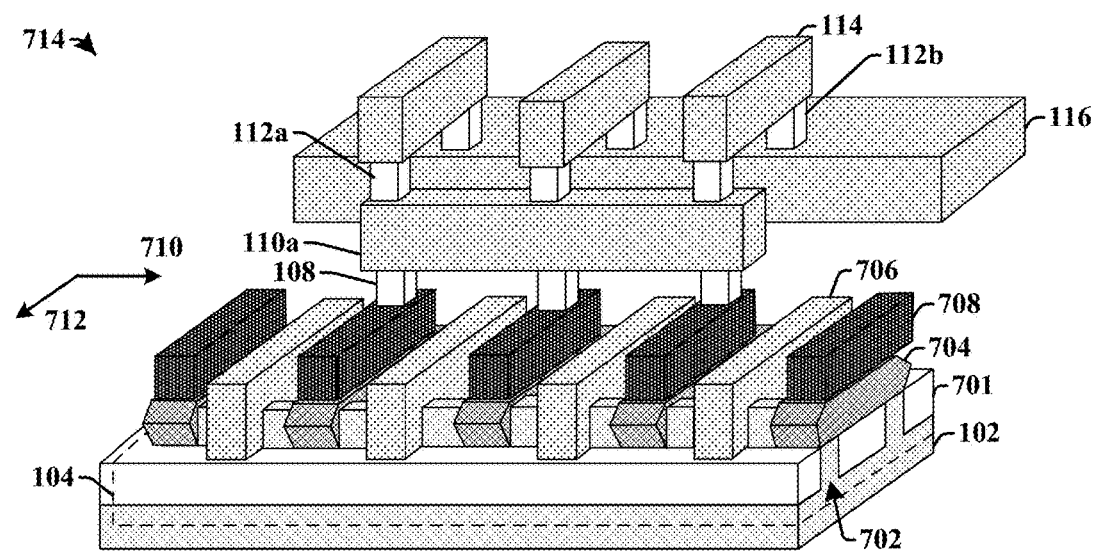
Figure 7C:
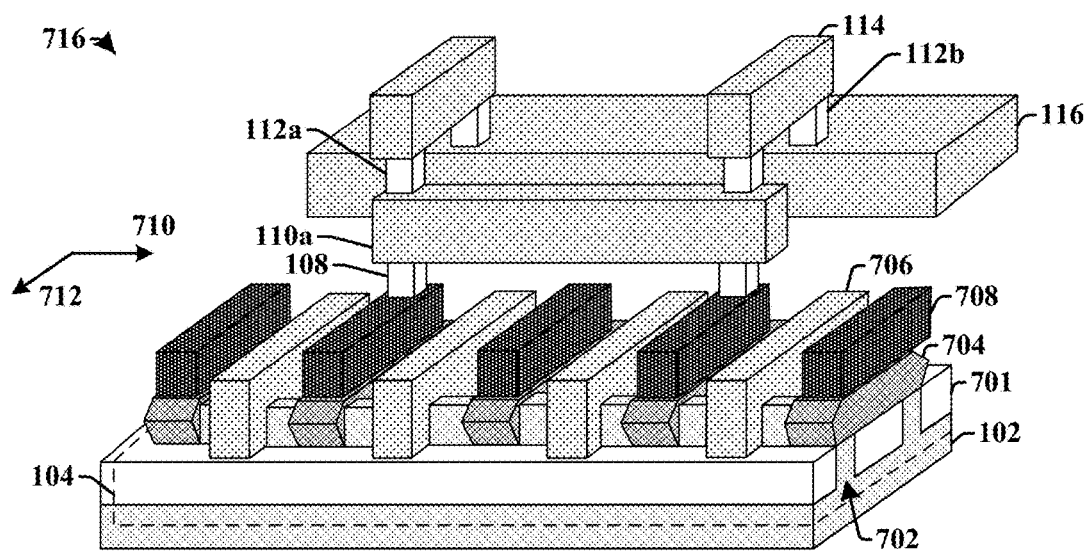

It has been appreciated that coupling a metal strap to a power rail may be especially useful in multi-gate device (e.g., double gate FinFETs, tri-gate FinFETs, omega FET, Gate all around (GAA), vertical GAA, etc.). FIGS. 7A-7C illustrate three-dimensional views of some embodiments of an integrated chip having a metal strap configured to couple a MEOL layer overlying a multi-gate FinFET device to a power rail.

FIG. 7A illustrates a three-dimensional view of some embodiments of an integrated chip 700 having a metal strap configured to couple a MEOL layer 708 overlying a multi-gate FinFET device to a power rail 116. The integrated chip 700 comprises an active area 104 having a plurality of fins of semiconductor material 702 protruding outward from a semiconductor substrate 102 and extending along a first direction 710. In some embodiments, the fins of semiconductor material 702 may be separated by isolation structures 701 (e.g., STI regions). The plurality of fins of semiconductor material 702 extend between source/drain regions 704 comprising highly doped regions of semiconductor material (e.g., having a doping concentration greater than that of the semiconductor substrate 102) so that a channel region is arranged within the plurality of fins of semiconductor material 702. In some embodiments, the source/drain regions 704 may comprise epitaxial source/drain regions located on the plurality of fins of semiconductor material 702.

A plurality of gate structures 706 are arranged over the plurality of fins of semiconductor material 702. The plurality of gate structures 706 extend along a second direction 712 that is perpendicular to the first direction 710. In some embodiments, the plurality of gate structures 706 may be arranged in a repeating pattern that extends along the first direction 710. A plurality of middle-end-of-the-line (MEOL) structures 708 are arranged over the plurality of fins of semiconductor material 702 at locations between adjacent ones of the plurality of gate structures 706. The plurality of MEOL structures 708 are in electrical contact with the plurality of fins of semiconductor material 702 and/or the source/drain regions 704.

The plurality of MEOL structures 708 are coupled to a first metal wire 110a by way of a first conductive contact 108 arranged vertically therebetween. The first metal wire 110a is further connected to an overlying metal strap 114 by way of a first conductive via 112a. The metal strap 114 laterally extends from over the first metal wire 110a to over a power rail 116. The metal strap 114 is connected to the power rail 116 by way of a second conductive via 112b.

FIGS. 7B-7C illustrate three-dimensional view of some alternative embodiments of integrated chips, 714 and 716, having a metal strap configured to couple a MEOL layer 708 overlying a multi-gate FinFET device to a power rail 116.

The integrated chips, 714 and 716, comprise a plurality of MEOL structures 708 interleaved between gate structures 706 overlying fins of semiconductor material 702. The plurality of MEOL structures 708 are coupled to a first metal wire 110a by way of conductive vias 108. The first metal wire 110a continuously extends over multiple conductive vias 108 so as to connect multiple MEOL structures together 708, further reducing current density. The first metal wire 110a is further connected to an overlying metal strap 114 by way of a plurality of first conductive vias 112a. The metal strap 114 laterally extends from over the first metal wire 110a to over a power rail 116. The metal strap 114 is connected to the power rail 116 by way of a second conductive via 112b.

Figure 8:
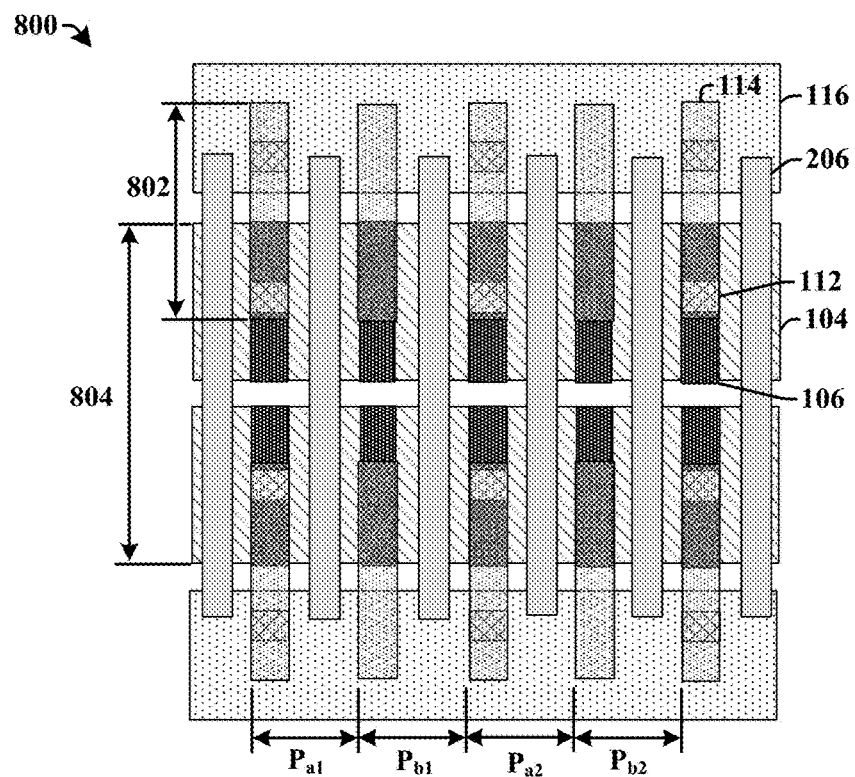
FIG. 8 illustrates some embodiments of a top-view of integrated chip having a metal strap configured to couple a MEOL layer to a power rail according to some design restrictions.

FIG. 8 illustrates some additional embodiments of an integrated chip 800 formed by a double patterning process and having a metal strap configured to couple a middle-end-of-the-line (MEOL) layer to a power rail.

The integrated chip 800 comprises a plurality of MEOL structures 106 arranged over an active area 104 of a semiconductor substrate 102. The plurality of MEOL structures 106 are electrically coupled to a power rail 116 by way of a plurality of metal straps 114. It has been appreciated that the impact of the metal straps 114 on performance of the integrated chip 800 increases as the number of gate structures 206 (i.e., the number of transistor devices) overlying the active area 104 increases. Accordingly, in some embodiments, the active area 104 may continuously extend past two or more gate structures 206. In other embodiments, the active area 104 may continuously extend past four or more gate structures 206.

In some embodiments, alternating ones of the plurality of MEOL structures 106 are arranged next to an adjacent MEOL structure at a first pitch $P_a$ (a MEOL pitch of a first mask of the double patterning process) or a second pitch $P_b$ (a MEOL pitch of a second mask of the double patterning process). In some embodiments misalignment errors may cause the first and second pitches, $P_a$ and $P_b$, to be slightly different. For example, the first pitch $P_a$ may have a pitch $P_{a1}$ that is equal to approximately $1.02 \sim 0.98 * P_{a2}$ and the second pitch $P_b$ may have a pitch $P_{b1}$ that is equal to approximately $1.02 \sim 0.98 * P_{b2}$.

In some embodiments, wherein the plurality of metal straps 114 are formed using a cut mask process, the metal straps 114 may have a length 802 that is greater than or equal to approximately 40% of the width 804 of the active areas 104. Such a length 802 prevents cut regions of a cut mask from being placed at a small space that can increase mask cost.

FIGS. 9-13 illustrate top-views and cross-sectional views corresponding to some embodiments of a method of forming an integrated chip a metal strap configured to couple a MEOL to a power rail.

Figure 9:
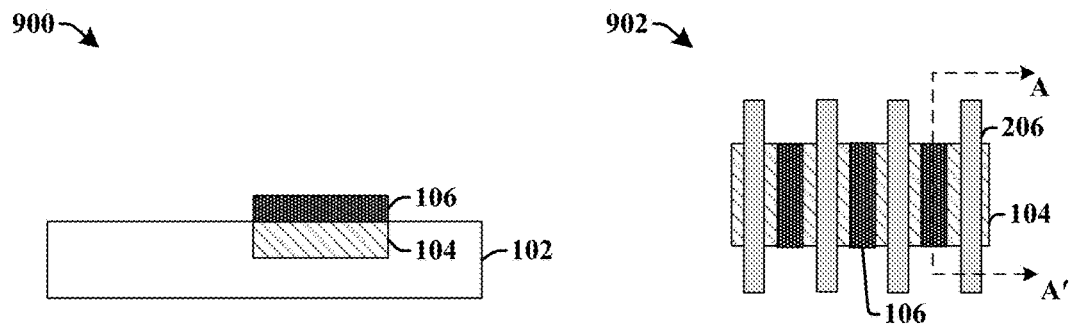
FIGS. 9-14 illustrate top-views and cross-sectional views corresponding to some embodiments of a method of forming an integrated chip having a metal strap configured to couple a MEOL layer to a power rail.

As shown in top-view 900 and cross-sectional view 902 of FIG. 9, a plurality of gate structures 206 are formed over a semiconductor substrate 102. In various embodiments, the semiconductor substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the plurality of gate structures 206 may be formed by forming a gate dielectric film over the semiconductor substrate 102, and subsequently forming a gate electrode film over the gate dielectric film. The gate dielectric film and the gate electrode film are subsequently patterned according to photolithography process to form a plurality of gate structures 206.

An active area 104 is formed between the plurality of gate structures 206. The active area 104 comprises a plurality of source/drain regions. In some embodiments, the plurality of source/drain regions may be formed by an implantation process that selectively implants a dopant species into the semiconductor substrate. In various embodiments, the dopant species may comprise a p-type dopant (e.g., boron, gallium, etc.) or an n-type dopant (e.g., phosphorus, arsenic, etc.). In other embodiments, the plurality of source/drain regions may be formed by an epitaxial growth process.

A plurality of MEOL structures 106 are formed over the active area 104 at locations laterally interleaved between the plurality of gate structures 206. The plurality of MEOL structures 106 may be formed by forming a MEOL layer onto the semiconductor substrate 102. The MEOL layer is then patterned according to a photolithography process to form the plurality of MEOL structures 106 over the source/drain regions. In various embodiments, photolithography process may comprise double patterned process (e.g., a SADP, LELE, etc.).

Figure 10:
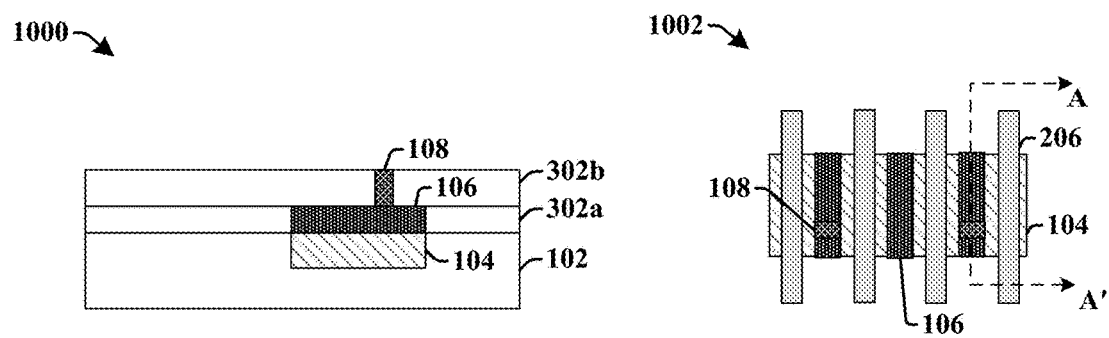

As shown in top-view 1000 and cross-sectional view 1002 of FIG. 10, one or more conductive contacts 108 are formed over the MEOL structure 106. In some embodiments, the one or more conductive contacts 108 are formed by depositing a first inter-level dielectric (ILD) layer 302a surrounding the MEOL structure 106 and a second ILD layer 302b over the first ILD layer 302a. The second ILD layer 302b is subsequently etched to form a contact opening. A conductive material (e.g., tungsten, copper, etc.) may be formed within the contact opening. In some embodiments, the conductive material may be formed by way of a vapor deposition process (e.g., PVD, CVD, PE-CVD, etc.) and/or a plating process (e.g., an electro-plating process or an electro-less plating process). A planarization process (e.g., a chemical mechanical polishing (CMP) process) is then performed to remove excess conductive material outside of the contact opening.

Figure 11:
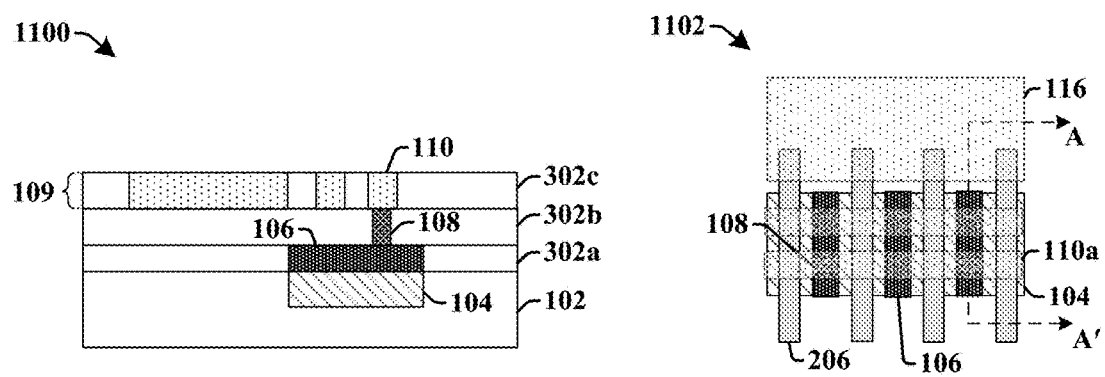

As shown in cross-sectional view 1100 and cross-sectional view 1102 of FIG. 11, a first metal wire layer 109 is formed over the one or more conductive contacts 108. The first metal wire layer 109 comprises a first metal wire 110a arranged over the active area 104. In some embodiments, the first metal wire layer 109 may further comprise a power rail 116. In some embodiments, the first metal wire layer 109 may be formed by depositing a third ILD layer 302c over the second ILD layer 302b. The third ILD layer 302c is subsequently etched to form a plurality of metal trenches. A conductive material (e.g., tungsten, copper, etc.) may be formed within the plurality of metal trenches. In some embodiments, the conductive material may be formed by way of a vapor deposition process (e.g., PVD, CVD, PECVD, etc.) and/or a plating process (e.g., an electro-plating process or an electro-less plating process). A planarization process (e.g., a CMP process) is then performed to remove excess conductive material outside of the contact opening.

Figure 12:
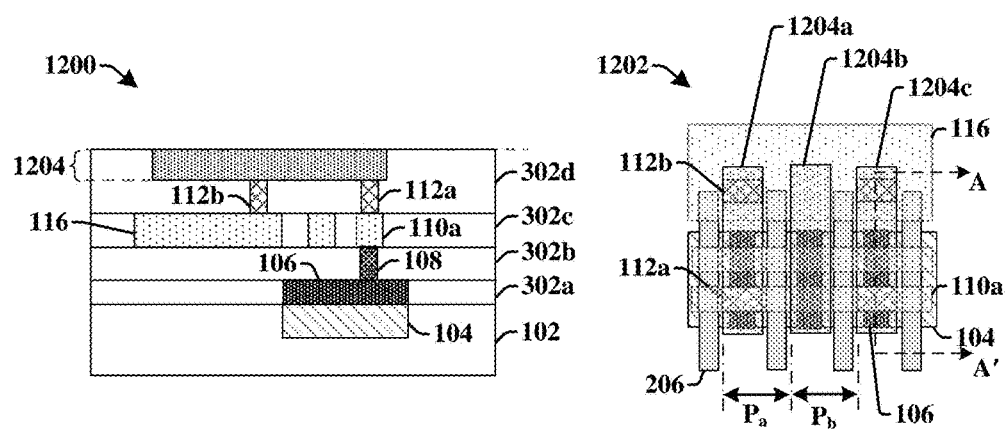

As shown in top-view 1200 and cross-sectional view 1202 of FIG. 12, one or more conductive vias 112a-112b and a second metal wire layer 1204 are formed over the first metal wire layer 109. The second metal wire layer 1204 may be extend perpendicular to the first metal wire layer 109. The second metal wire layer 1204 comprises a second metal wire 1204a, a third metal wire 1024b, and a fourth metal wire 1204c. In some embodiments, the one or more conductive vias 112 and the second metal wire layer 1204 are formed by depositing a fourth ILD layer 302d over the third ILD layer 302c. The fourth ILD layer 302d is subsequently etched to form one or more via openings and a metal trench. A conductive material (e.g., tungsten, copper, etc.) may be formed within the one or more via openings and the metal trench. In some embodiments, the conductive material may be formed by way of a vapor deposition process (e.g., PVD, CVD, PE-CVD, etc.) and/or a plating process (e.g., an electro-plating process or an electro-less plating process).

In some embodiments, the second metal wire layer 1204 may be formed by way of a double patterning process. The double patterning process causes alternating ones of the plurality of MEOL structures 106 to be arranged next to an adjacent MEOL structure at a first pitch $P_a$ (a. MEOL pitch of a first mask of the double patterning process) or a second pitch $P_b$ (a MEOL pitch of a second mask of the double patterning process). In some embodiments, misalignment errors may cause the first and second pitches, $P_a$ and $P_b$, to be slightly different, as explained above.

Figure 13:
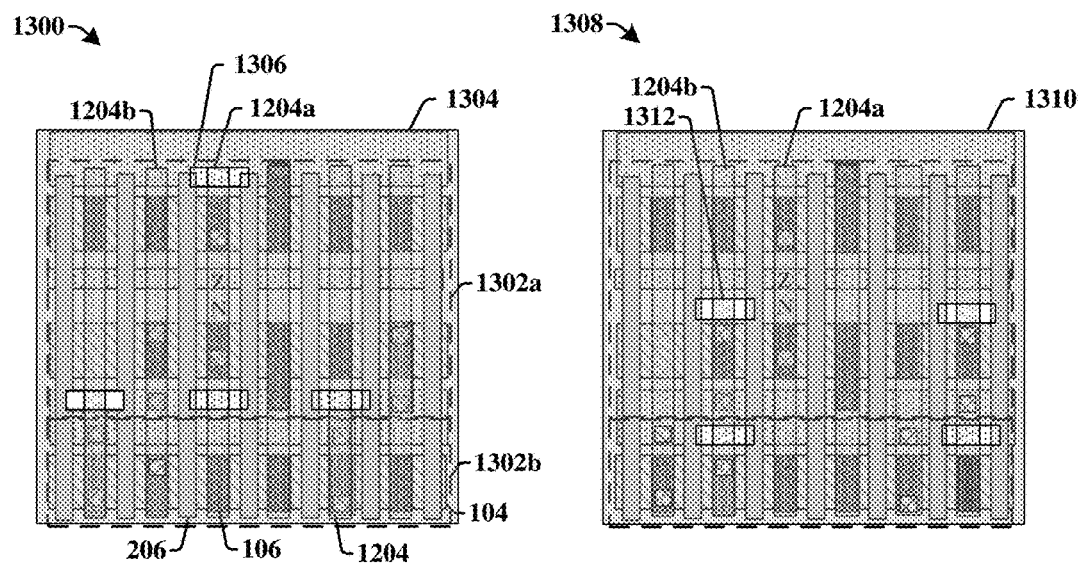
Figure 14:
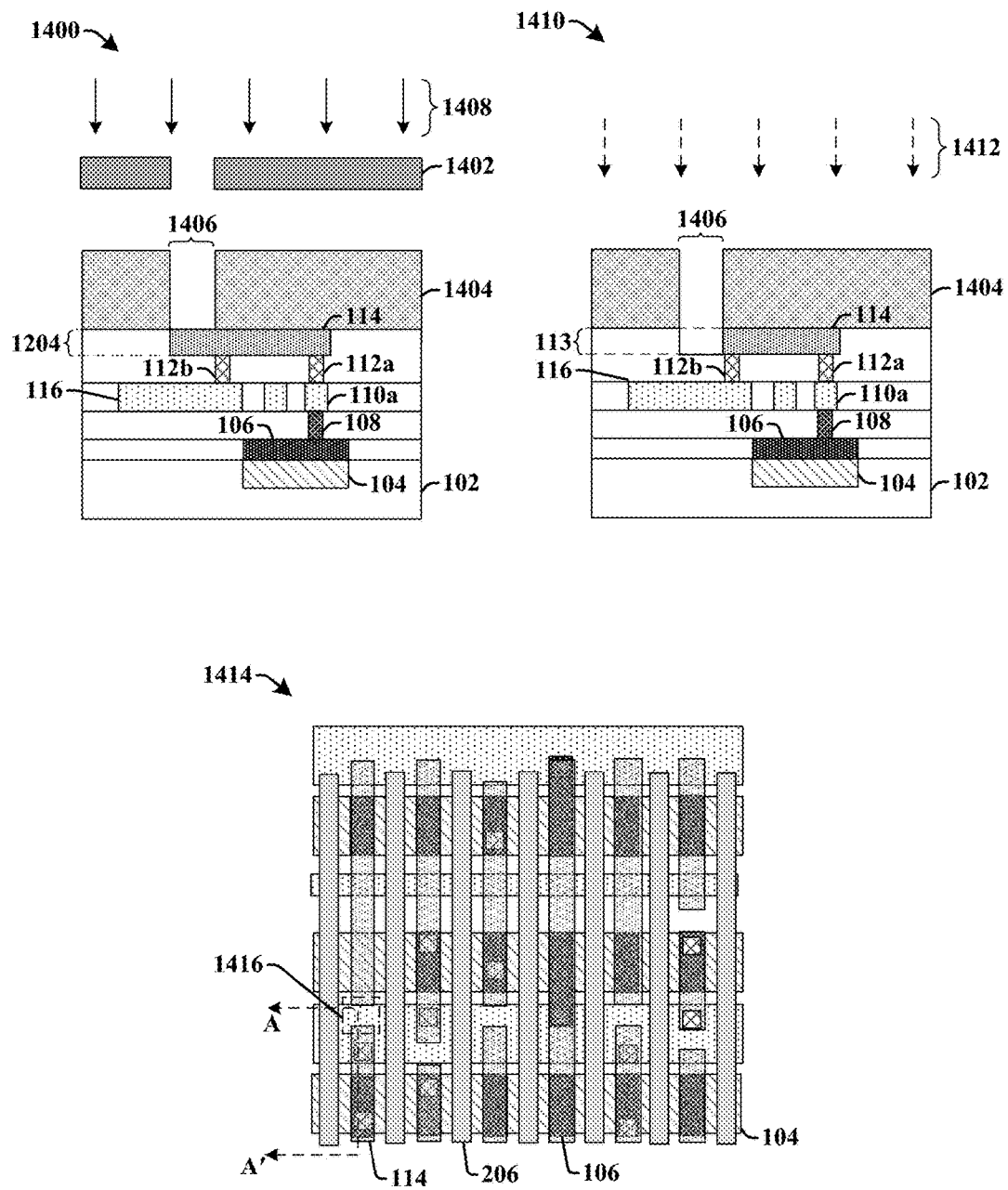

In some embodiments, shown in FIGS. 13-14, the second metal wire layer 1204 may be selectively cut (i.e., trimmed) according to a cut mask to form a metal strap and to prevent the second metal wire layer 1204 from causing electrical shorts within an integrated chip.

As shown in FIG. 13, a first cut mask 1304 and a second cut mask 1310 may be used in a patterning process that selectively removes parts of the second metal wire layer 1204 to form one or more metal straps. The first cut mask 1304 and the second cut mask 1310 respectively comprise cut regions, 1306 and 1312, in which the second metal wire layer 1204 is to be cut (i.e., trimmed).

In some embodiments, the location of cut regions, 1306 and 1312, within the first cut mask 1304 and the second cut mask 1310 may be limited by design rules. For example, in some embodiments, a first cell 1302a and a second cell 1302b may be arranged to prevent cut regions from overlapping and/or to prevent cut regions on a same cut mask from having jogs that can lead to higher mask costs. In such embodiments, a first metal wire connected to an output node ZN 1204a on the second metal wire layer and an adjacent metal wire 1204b used as a metal strap may be placed separate masks (i.e., be assigned different colors for a decomposition algorithm that breaks the design data onto separate photomasks). The separate masks are cut by separate cut masks, so that the cuts of a single mask do not overlap. This leads to a first cut mask 1304 having cut regions 1306 that are aligned along an edge of a cell 1302a and a second cut mask 1308 having cut regions 1312 that are aligned along an edge of a cell 1302b (e.g., and prevents jogs in cut regions on a same mask from being placed on opposing sides of a boundary between adjacent cells). In some additional embodiments, the second metal wire layer may be drawn in a cell 1302 so that the cell is not populated by an automatic place and route software during design.

FIG. 14 illustrates cross-sectional views and a top-view showing the cut process according to the cut masks of FIG. 13.

As shown in cross-sectional view 1400, a patterning process patterns a masking layer 1404 overlying the semiconductor substrate 102 according to a cut mask 1402 to form openings 1406 within the masking layer 1404. The openings 1406 are arranged over a part of the second metal wire layer 1204. In some embodiments, the masking layer 1404 may comprise a photoresist layer. In such embodiments, the masking layer 1404 may be patterned by selectively exposing the masking layer 1404 to radiation 1408 according to the cut mask 1402, and subsequently developing the masking layer 1404 to form the openings 1406.

As shown in cross-sectional view 1410, an etching process is used to selectively remove a part of the second metal wire layer (e.g., 1204 of cross-sectional view 1400) according to the openings 1406 to form a metal strap 114. The etching process exposes the second metal wire layer underlying the openings 1406 to an etchant 1412, which selectively cuts or trims the second metal wire layer. In various embodiments, the etchant 1412 may comprise a dry etchant (e.g., a plasma etch with tetrafluoromethane ($CF_4$), sulfur hexafluoride ($SF_6$), nitrogen trifluoride ($NF_3$), etc.) or a wet etchant (e.g., hydroflouric (HF) acid). Top-view 1414 shows a top view of an integrated circuit after cuts have been made to form cut areas 1416 in which the second metal wire layer has been removed. As shown, the cut areas 1416 are aligned along a border/edge of the cells shown in FIG. 13.

While FIGS. 13-14 illustrate the use of a 'cut last' technique that cuts the second metal wire layer 1204, it will be appreciated that other cut techniques may be used. For example, in some alternative embodiments, a 'cut first' technique may be used to form a material on cut regions so that the second metal wire layer 1204 will be excluded from being formed in the cut regions.

Figure 15:
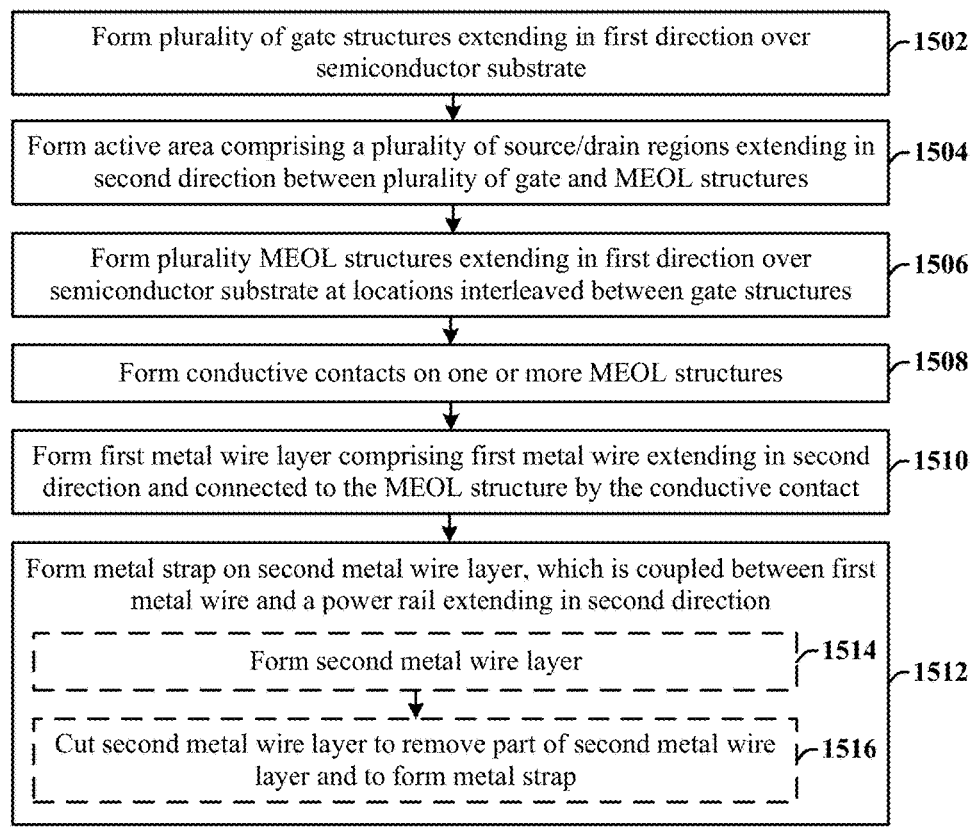
FIG. 15 illustrates a flow diagram of some embodiments of a method of forming an integrated chip having a metal strap configured to couple a MEOL layer to a power rail.

FIG. 15 illustrates a flow diagram of some embodiments of a method 1500 of forming an integrated chip having a metal strap configured to couple a MEOL layer to a power rail.

While the disclosed method 1500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, a plurality of gate structures are formed extending over a semiconductor substrate in a first direction. FIG. 9 illustrates some embodiments corresponding to act 1502.

At 1504, an active area is formed within a semiconductor substrate. The active area extends in a second direction between the plurality of gate structures and the plurality of MEOL structures. In some embodiment, the active area may comprise source/drain region arranged within a substrate. In other embodiments, the active area may comprise a plurality of fins of semiconductor material may be formed to protrude from a semiconductor substrate in some embodiments. FIG. 9 illustrates some embodiments corresponding to act 1506.

At 1506, a plurality of MEOL structures are formed extending over the semiconductor substrate in the first direction at locations interleaved between the plurality of gate structures. FIG. 9 illustrates some embodiments corresponding to act 1504.

At 1508, one or more conductive contacts are formed on the MEOL structure. FIG. 10 illustrates some embodiments corresponding to act 1508.

At 1510, a first metal wire layer is formed over the one or more conductive contacts. The first metal wire layer comprise a first metal wire extending in a second direction and coupled to the MEOL structures by one of the one or more conductive contacts. FIG. 11 illustrates some embodiments corresponding to act 1510.

At 1512, a metal strap is formed on second metal wire layer. The metal strap is coupled between the first metal wire and power rail. The power rail extends in the second direction and is configured to provide a voltage (e.g., a supply voltage (VSS) or a ground voltage (VDD)) to multiple transistor devices arranged over a shared active area.

In some embodiments, the metal strap is formed by forming a second metal wire layer over the first metal wire layer (1514) and by subsequently cutting the second metal wire layer to remove a part of the second metal wire layer and to form the metal strap (1516). FIGS. 12-14 illustrate some embodiments corresponding to act 1514-1516.

Therefore, the present disclosure relates to an integrated chip that uses a metal strap to improve performance and reduce electromigration by coupling a middle-end-of-the-line (MEOL) layer to a power rail.

In some embodiments, the present disclosure relates to an integrated chip. The integrated chip comprises an active area comprising a plurality of source/drain regions, and a middle-end-of-the-line (MEOL) structure contacting the active area and extending in a first direction. The integrated chip further comprises a first metal wire layer having a first metal wire connected to the MEOL structure by a conductive contact, wherein the first metal wire extends in a second direction perpendicular to the first direction. The integrate chip further comprises a power rail located on a metal wire layer that extends in a second direction at a location laterally offset from the active area, and a metal strap extending in the first direction and connected to the first metal wire by a first conductive via and to the power rail by a second conductive via.

In other embodiments, the present disclosure relates to an integrated chip. The integrated chip comprises an active area comprising a plurality of source/drain regions, and a plurality of middle-end-of-the-line (MEOL) structures contacting the active area and extending in a first direction. The integrated chip further comprises a plurality of gate structures interleaved between the plurality of MEOL structures and extending in the first direction, and a first metal wire layer comprising a first metal wire connected to one or more of the MEOL structures by conductive contacts, wherein the first metal wire extends in a second direction perpendicular to the first direction. The integrated chip further comprises a power rail located on a metal wire layer that extends in a second direction at a location laterally separated from the active area, wherein the power rail has a larger width than the first metal wire, and a metal strap extending in the first direction and connected to the first metal wire by a first conductive via and to the power rail by a second conductive via.

In yet other embodiments, the present disclosure relates to a method of forming an integrated chip. The method comprises forming a plurality of gate structures over a semiconductor substrate, and forming an active area comprising a plurality of source/drain regions, wherein the active area intersects the plurality of gate structures. The method further comprises forming a plurality of middle-end-of-the-line (MEOL) structures laterally interleaved between the plurality of gate structures over the active area. The method further comprises connecting the plurality of MEOL structures to a power rail by way of a metal strap vertically overlying the plurality of MEOL structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
    forming a plurality of gate structures extending in a second direction over an active area of a substrate;
    forming a plurality of middle-end-of-the-line (MEOL) structures extending in the second direction over the active area, wherein the plurality of MEOL structures are interleaved between the plurality of gate structures along a first direction;
    forming a power rail that extends in the first direction;
    forming a first metal wire extending in the first direction over the plurality of MEOL structures;
    performing a double patterning process to form a second metal wire extending in the second direction over the first metal wire and a third metal wire extending in the second direction over the first metal wire, wherein the second metal wire is separated from the third metal wire along the first direction; and cutting the second metal wire according to a first cut region of a first cut mask to define a first metal strap connecting a first one of the plurality of MEOL structures to the power rail.

2. The method of claim 1,
wherein the first metal wire is connected to the first one of the plurality of MEOL structures by way of a first conductive contact; and
wherein the first metal strap is connected to the first metal wire by way of a first conductive via.

3. The method of claim 2, wherein the first metal strap is connected to the power rail by way of a second conductive via underlying the first metal strap.

4. The method of claim 3, further comprising:
a dielectric structure over the substrate, wherein the dielectric structure laterally surrounds the first metal strap and completely covers an upper surface of the first metal strap.

5. The method of claim 1, further comprising:
cutting the third metal wire according to a second cut region of a second cut mask, wherein the first cut region is offset from the second cut region by a non-zero distance along the second direction.

6. The method of claim 5, further comprising:
forming a lower power rail extending in the first direction, wherein a conductive contact couples the lower power rail to a second one of the plurality of MEOL structures that extends past the first one of the plurality of MEOL structures to directly below the power rail; and
wherein the power rail is arranged directly over the lower power rail.

7. The method of claim 1,
wherein the first metal strap is connected to the power rail by way of a conductive via overlying the first metal strap;
wherein a second one of the plurality of MEOL structures extends in the second direction past the first one of the plurality of MEOL structures; and
wherein a second conductive contact couples the second one of the plurality of MEOL structures to a lower power rail extending in the second direction directly below the power rail.

8. The method of claim 7,
wherein the second one of the plurality of MEOL structures continuously extends from over the active area to directly below the power rail; and
wherein the second conductive contact is directly below the power rail.

9. The method of claim 1, wherein a line extending in the first direction along an end of the first metal strap is offset from an end of the third metal wire by a non-zero distance along the second direction.

10. The method of claim 1,
wherein the double patterning process is used to form a fourth metal wire;
wherein the second metal wire is arranged at a first pitch with respect to the third metal wire and the third metal wire is arranged at a second pitch with respect to the fourth metal wire; and
wherein the first pitch is different than the second pitch.

11. The method of claim 10, wherein the first pitch is equal to the second pitch multiplied by a value in a range of between approximately 0.98 and approximately 1.02.

12. The method of claim 1, wherein the first metal strap has a length extending along the second direction that is greater than or equal to approximately 40% of a width of the active area along the second direction.

13. A method of forming an integrated chip, comprising:
forming a plurality of gate structures extending in a second direction over a first active area within a substrate;
forming a plurality of middle-end-of-the-line (MEOL) structures extending in the first direction over the first active area, wherein the plurality of MEOL structures contact the first active area and are interleaved between the plurality of gate structures along a first direction perpendicular to the second direction;
forming a power rail and a first metal wire extending in the second direction on a first metal layer;
forming a second metal wire on a second metal layer over the first metal layer, wherein the second metal wire extends over the first active area and a second active area; and
using a first cut mask to cut the second metal wire between the first active area and the second active area to define a metal strap that connects a first one of the plurality of MEOL structures to the power rail.

14. The method of claim 13, further comprising:
forming a third metal wire on the second metal layer, wherein the second metal wire and the third metal wire are formed using separate masks; and
trimming the third metal wire according to a second cut region of a second cut mask.

15. The method of claim 14,
forming a fourth metal wire on the second metal layer wherein the second metal wire and the fourth metal wire are formed using a same mask; and
wherein the second metal wire is arranged at a first pitch with respect to the third metal wire and the third metal wire is arranged at a second pitch with respect to the fourth metal wire; and
wherein the first pitch is equal to the second pitch multiplied by a value in a range of between approximately 0.98 and approximately 1.02.

16. The method of claim 14,
wherein the first metal wire is connected to the first one of the plurality of MEOL structures by way of a first conductive contact; and
wherein the metal strap is connected to the first metal wire by way of a first conductive via.

17. The method of claim 16, further comprising:
a dielectric structure over the substrate, wherein the dielectric structure laterally surrounds the metal strap and completely covers an upper surface of the metal strap.

18. A method of forming an integrated chip, comprising:
forming a plurality of gate structures extending in a second direction over an active area within a substrate;
forming a first middle-end-of-the-line (MEOL) structure and a second MEOL structure extending in the second direction over the active area and interleaved between the plurality of gate structures along a first direction perpendicular to the second direction, wherein the second MEOL structure extends a non-zero distance past the first MEOL structure along the second direction;
forming a first power rail extending in the first direction, wherein the first power rail is coupled to the second MEOL structure by a first conductive path comprising a conductive contact directly below the first power rail;
forming a first metal wire extending in the first direction over the first MEOL structure;
forming a metal strap coupled to the first metal wire; and forming a second power rail extending in the first direction over the first power rail, wherein the second power rail is coupled to the first MEOL structure along a second conductive path comprising the first metal wire and the metal strap.

19. The method of claim 18, wherein the first PMOL structure does not extend to directly below the first power rail.

20. The method of claim 18, further comprising:
a dielectric structure over the substrate, wherein the dielectric structure laterally surrounds the metal strap and completely covers an upper surface of the metal strap.

* * * * *